(12) United States Patent
Abboud et al.

(10) Patent No.: US 11,280,701 B2
(45) Date of Patent: Mar. 22, 2022

(54) ACQUISITION MODULE FOR A SYSTEM FOR MONITORING A ROTATING MACHINE, MONITORING SYSTEM AND METHOD

(71) Applicant: SAFRAN, Paris (FR)

(72) Inventors: Dany Abboud, Moissy-Cramayel (FR); Mohamed El Badaoui, Moissy-Cramayel (FR)

(73) Assignee: SAFRAN, Paris (FR)

( * ) Notice: Subject to any disclaimer, the term of this patent is extended or adjusted under 35 U.S.C. 154(b) by 0 days.

(21) Appl. No.: 17/045,690

(22) PCT Filed: Apr. 2, 2019

(86) PCT No.: PCT/EP2019/058295
§ 371 (c)(1),
(2) Date: Oct. 6, 2020

(87) PCT Pub. No.: WO2019/197220
PCT Pub. Date: Oct. 17, 2019

(65) Prior Publication Data
US 2021/0080352 A1 Mar. 18, 2021

(30) Foreign Application Priority Data

Apr. 9, 2018 (FR) ...................................... 1853050

(51) Int. Cl.
*G01M 15/14* (2006.01)
*G01M 15/02* (2006.01)
*H03M 1/12* (2006.01)

(52) U.S. Cl.
CPC ............ *G01M 15/14* (2013.01); *G01M 15/02* (2013.01); *H03M 1/128* (2013.01)

(58) Field of Classification Search
CPC .............................. G01M 15/02; G01M 15/14
See application file for complete search history.

(56) References Cited

U.S. PATENT DOCUMENTS

| 2021/0063276 A1* | 3/2021 | Abboud | ................ G01M 15/14 |
| 2021/0148946 A1* | 5/2021 | Djelassi | .................. G01P 3/489 |
| 2021/0239570 A1* | 8/2021 | Abboud | .............. G01M 13/028 |

FOREIGN PATENT DOCUMENTS

| EP | 2507924 A1 | 10/2012 |
| JP | 2012-079618 A | 4/2012 |

(Continued)

OTHER PUBLICATIONS

Search Report from French Intellectual Property Office on corresponding FR application (FR1853050) dated Oct. 31, 2018.
(Continued)

*Primary Examiner* — Eric S. McCall
(74) *Attorney, Agent, or Firm* — Klein, O'Neill & Singh, LLP

(57) ABSTRACT

The invention relates to an acquisition module for a monitoring system of a rotating machine, in particular of an aircraft engine, the acquisition module comprising at least one measurement sensor for measuring an analogue signal x(t) of a physical quantity of a member of the rotating machine, at least one sample-and-hold device configured to collect a sample of the analogue signal x(t) at sampling times t n and to maintain it constant between two sampling times t n, and at least one memory for storing samples, the sample-and-hold device being configured to collect a sample of the analogue signal x(t) at sampling times t n defined in a random manner, the sampling times t n being defined according to the following law t n=nΔ t+τ n, the samples and the sampling times t n being stored in the memory.

10 Claims, 3 Drawing Sheets

(56) References Cited

FOREIGN PATENT DOCUMENTS

| WO | WO 01/23861 A1 | 4/2001 |
| WO | WO 2011/068992 A1 | 6/2011 |
| WO | WO 2015/131396 A1 | 9/2015 |

OTHER PUBLICATIONS

International Search Report and Written Opinion on corresponding PCT application (PCT/EP2019/058295) from International Searching Authority (EPO) dated Jun. 3, 2019.
M.M Bech et al.: "Field-oriented control of an induction motor using random pulsewidth modulation", IEEE Transactions on Industry Applications, Nov. 1, 2001, pp. 1777-1785, XP055519719, New York.

* cited by examiner

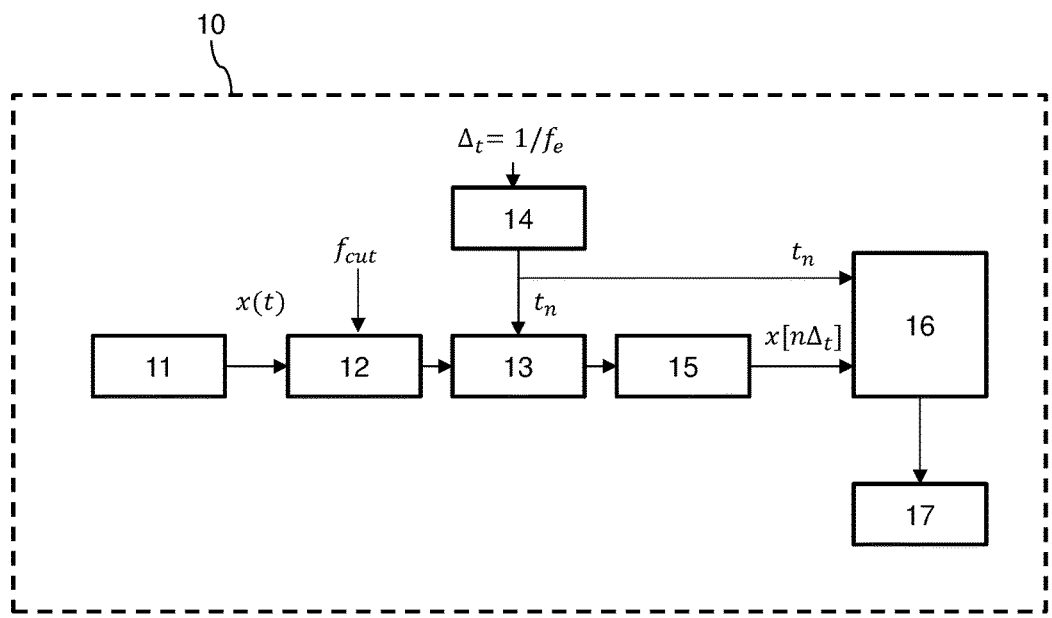
FIGURE 3
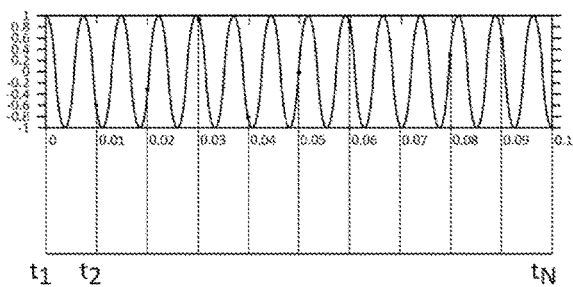
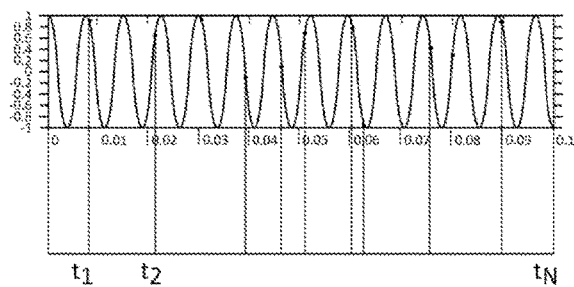
PRIOR ART
FIGURE 4  FIGURE 5

# ACQUISITION MODULE FOR A SYSTEM FOR MONITORING A ROTATING MACHINE, MONITORING SYSTEM AND METHOD

TECHNICAL FIELD

The present invention relates to the field of the monitoring of rotating machines, in particular, the monitoring of an aircraft engine.

In order to enable preventive maintenance of an aircraft engine to be carried out, it is known to use a monitoring system to track the state of health of different parts of the aircraft engine, for example, a gearing, a bearing, a moving vane, etc.

In a known manner, a monitoring system comprises a module for acquiring a signal, hereafter acquisition module, and a processing module configured to compute mathematical estimators making it possible to define the state of health of the aircraft engine.

With reference to FIG. 1, the acquisition module 110 comprises a measurement sensor 111 configured to measure a physical quantity, for example an acceleration, and to convert it into an analog signal x(t), in particular, an analog voltage signal. The acquisition module 110 comprises a sample and hold device 113, configured to collect a sample of the analog signal x(t) and to maintain it constant over a hold time $\Delta_t$ controlled by a timer 114. In a known manner, the sample and hold device 113 has a sampling frequency $f_e$ which is chosen to respect the Shannon theorem, that is to say, be at least equal to double the maximum frequency contained in the analog signal x(t) to sample. In a known manner, the hold time $\Delta_t$ is fixed and is a function of the sampling period $\Delta_t=1/f_e$. Also, samples are collected at times $t_n=n\Delta_t$ where n is a natural integer.

Still with reference to FIG. 1, the acquisition module 110 further comprises an anti-aliasing filter 112 configured to reject components having a frequency above the Shannon frequency. In a known manner, the anti-aliasing filter 112 has a cut-off frequency $f_{cut}$ defined as half the sampling frequency $f_e/2$. The anti-aliasing filter 112 is positioned between the measurement sensor 111 and the sample and hold device 113.

The acquisition module 110 also comprises an analog-digital converter 115 configured to transform the samples of the analog signal into a digital magnitude $x[n\Delta_t]$ quantified on a limited number of bits which depends on the desired precision. As illustrated in FIG. 1, the acquisition module 110 further comprises a storage memory 116 to record the digital samples $x[n\Delta_t]$. In this example, the acquisition module 110 further comprises a communication module 117, for example by satellite means, so as to transmit the data of the memory 117 to a signal processing module situated on the ground in a control center.

In a known manner, the signal processing module is in the form of a computing unit comprising a microprocessor to perform digital processing operations of the signal on the digital samples $x[n\Delta_t]$ in order to deduce therefrom diagnostic information. The digital operations may be diverse and concern simple statistical indicators (root mean square, Kurtosis, crest factor, etc.) but also transforms in the spectral domain (spectrum, envelope analysis, etc.).

Transforms in the spectral domain are particularly relevant in the field of the monitoring of a rotating machine given that a rotating machine generates signals of which the statistics evolve (quasi-) periodically over time. The periodicity can manifest itself in 1st order or 2nd order.

For example, in 1st order, the average of the signal is periodic and the spectrum is a discrete distribution of the harmonics linked to the frequencies associated with the rotating element. The spectrum of a signal $x[n\Delta_t]$ of length L may be evaluated by applying the discrete Fourier transform (DFT) defined as:

$$S_x[m\Delta_f]=TFD_{n\to m}^N\{|x[x\Delta_t]|\}=1/N\Sigma_{n=1}^N x[n\Delta_t]e^{j2\pi nm/N}$$

Where m=1, 2 ... N and $$\Delta_f = \frac{1}{L\Delta_t} = f_e/2$$

designates the frequency resolution which is proportional to the sampling frequency $f_e$ and inversely proportional to the number of points. The factor 1/N is optional but signifies that the quantity is relative to the Fourier coefficients. In a known manner, the above transform may be computed by the FFT (Fast Fourier Transform) algorithm. In general, the amplitude of $X[m\Delta_f]$ on certain frequencies provides precious information on the rotating machine. A typical example is the vibratory signal emitted by a simple axis of rotation or by a gearing.

In 2nd order, the average of the signal is zero, its spectrum is continuous and thus does not comprise information on the kinematics of the system. Conversely, the envelope of the signal is periodic and its spectrum exhibits harmonics linked to the kinematics of the rotating part. A typical example is the vibrations emitted by a defective ball bearing. In this case, the spectrum is normally incapable of highlighting defect frequencies, whereas the envelope spectrum reveals defect frequencies. The square envelope spectrum (SES) is thus a second precious diagnostic operator, it is defined as:

$$P_{2x}[m\Delta_f]=TFD_{n\to m}^N\{|x[n\Delta_t]|^2\}$$

In practice, in the field of monitoring a rotating machine, it is known to use a sampling frequency $f_e$ above 20 kHz or above 50 kHz. Also, in the case of continuous monitoring, very numerous digital samples $x[n\Delta_t]$ must be stored in the memory 116 and transmitted via the communication module 117. This presents numerous drawbacks.

Firstly, the cost of transmission of the digital samples $x[n\Delta_t]$ by satellite means depends on the amount of data transmitted. Very numerous digital samples $x[n\Delta_t]$ thus bring about significant transmission costs. To eliminate this drawback, one solution would be to only transmit a part of the digital samples $x[n\Delta_t]$ but this would affect the relevance of the estimators computed by the processing module.

Similarly, the more numerous the digital samples $x[n\Delta_t]$, the more it is necessary to provide a memory 116 of which the dimension is important, which increases its cost but also its mass, which is restrictive for aeronautical applications.

Finally, the electrical consumption of the sample and hold device 113 depends on its sampling frequency $f_e$. This is problematic for the monitoring of a rotating machine that is autonomous in energy, for example, in the case of offshore wind turbines.

The aim of the invention is thus to overcome these drawbacks by proposing a monitoring system which makes it possible to carry out a reliable diagnostic for a rotating machine with a reduced number of samples.

In an incidental manner, the patent application WO 2015131396 A1 teaches a method for forming a spectrum from a signal sampled in a random manner. In this application, particular "saw tooth" signals are used in order to carry out a compression. The objective is very far from that of the present invention.

In addition, the patent application WO 01/23861 A1 teaches a device for spectral analysis of a vibratory signal of a bearing or a shaft in which it is proposed to sample an analog signal of a sensor, to filter it then to analyze its spectrum.

SUMMARY

To this end, the invention relates to an acquisition module for a system for monitoring a rotating machine, in particular an aircraft engine, the acquisition module comprising:
- at least one sensor for measuring an analog measurement signal x(t) of a physical quantity of a part of the rotating machine,
- at least one sample and hold device configured to collect a sample of the analog signal x(t) at sampling times $t_n$ and to maintain it constant between two sampling times $t_n$,
- at least one memory for storing samples.

The acquisition module is remarkable in that the sample and hold device is configured to collect a sample of the analog signal x(t) at sampling times $t_n$ defined in a random manner, the sampling times $t_n$ being defined according to the following law $$t_n = n\Delta_t + \tau_n$$

in which
- n is a natural integer
- $\Delta_t = 1/f_e$ where $f_e$ is the sampling frequency of the sample and hold device (13)
- $\tau_n$ is a random variable having a uniform probability law over $$\left[-\frac{\Delta_t}{2}; +\frac{\Delta_t}{2}\right]$$

the samples and the sampling times $t_n$ being stored in the memory

Thanks to the invention, the samples are no longer collected at a same time interval but are collected in a random manner, which advantageously makes it possible to reduce the sampling frequency compared to the prior art and thus to limit the number of samples to transmit. This is particularly advantageous for continuous remote monitoring of an aircraft engine. The use of such a probability law is advantageous because it allows optimal spectral statistical properties, the quadratic estimation error being minimal. Furthermore, it makes it possible to obtain unbiased estimators and a minimum variance of the sampling noise. Thanks to the samples and to the sampling times $t_n$ stored in the memory, the monitoring system may form at least one relevant estimator of the state of health of the rotating machine.

Preferably, the acquisition module comprises at least one analog bandpass filter having a cut-off frequency $f_{cut}$, the analog bandpass filter being positioned between the measurement sensor and the sample and hold device. Such a bandpass filter makes it possible to minimize the variance of the spectral estimators computed by the processing module. Precision is enhanced.

In a preferred manner, the ratio $f_{cut}/f_e$ is comprised between 3 and 6.

Random sampling has the advantage of not being restricted by the Nyquist limit like uniform sampling. It is thus possible to use a high cut-off frequency and a sampling frequency that is low.

According to a preferred aspect of the invention, the sampling frequency $f_e$ is below 20 kHz, preferably, comprised between 100 Hz and 1000 Hz, further preferably, comprised between 300 Hz and 500 Hz.

According to an aspect of the invention, the acquisition module comprises a plurality of analog bandpass filters each having a cut-off frequency, the analog bandpass filters being positioned between the measurement sensor and the sample and hold device. The use of analog bandpass filters makes it possible to define a plurality of elementary frequency ranges which are each sampled in an independent manner by the sample and hold device. Advantageously, it is possible to parameterize the elementary frequency range to highlight in a relevant manner a potential defect of the part of the aircraft engine over this elementary frequency range. An elementary frequency range makes it possible to increase the signal to noise ratio, which facilitates the detection of a potential malfunction.

Preferably, the analog bandpass filters are mounted in parallel with each other. Thus, several independent defects may be highlighted.

In a preferred manner, the acquisition module comprises an analog-digital converter configured to transform the samples of the sample and hold device into digital samples $x[n\Delta_t]$.

The invention also relates to a monitoring system comprising an acquisition module such as described previously and at least one processing module configured to compute at least one health estimator from the samples and sampling times $t_n$ obtained from said acquisition module.

In a preferred manner, the acquisition module is configured to transmit the samples and the sampling times $t_n$ in a wireless manner to the processing module, in particular, by satellite means. The reduction in the number of samples advantageously makes it possible to reduce the transmission cost.

Preferably, the processing module comprises a device for transforming the samples according to a Dirichlet transform. Such a transform makes it possible to form relevant estimators from the samples obtained randomly and the sampling times $t_n$.

The invention further relates to an aircraft comprising an aircraft engine and an acquisition module such as described previously of which the measurement sensor is positioned on a part of the aircraft engine.

The invention further relates to a method for monitoring a rotating machine, in particular an aircraft engine, by use of an acquisition module such as described previously, the method comprising:
- a step of measuring an analog measurement signal x(t) of a physical quantity of a part of the rotating machine
- a step of sampling the analog signal x(t) at sampling times $t_n$ defined according to the following law $$t_n = n\Delta_t + \tau_n$$

in which
- n is a natural integer
- $\Delta_t = 1/f_e$ where $f_e$ is the sampling frequency of the sample and hold device (13)
- $\tau_n$ is a random variable having a uniform probability law over $$\left[-\frac{\Delta_t}{2}; +\frac{\Delta_t}{2}\right].$$

a step of recording the samples and the sampling times $t_n$

BRIEF DESCRIPTION OF THE DRAWINGS

The invention will be better understood on reading the description that follows, given uniquely as an example, and by referring to the appended drawings among which:

FIG. 3 is a schematic representation of an acquisition module according to a first embodiment of the invention, FIG. 4 is a schematic representation of uniform sampling according to the prior art, FIG. 5 is a schematic representation of random sampling according to the invention and FIG. 6 is a schematic representation of an acquisition module according to a second embodiment of the invention.

It should be noted that the figures set out the invention in a detailed manner for implementing the invention, said figures obviously being able to serve to better define the invention if need be.

DETAILED DESCRIPTION

A monitoring system according to an embodiment of the invention for monitoring an engine of an aircraft such as an airplane or a helicopter will henceforth be described. However, it goes without saying that the invention applies to any rotating machine, in particular, a wind turbine, a terrestrial vehicle engine, etc.

Figure 1:
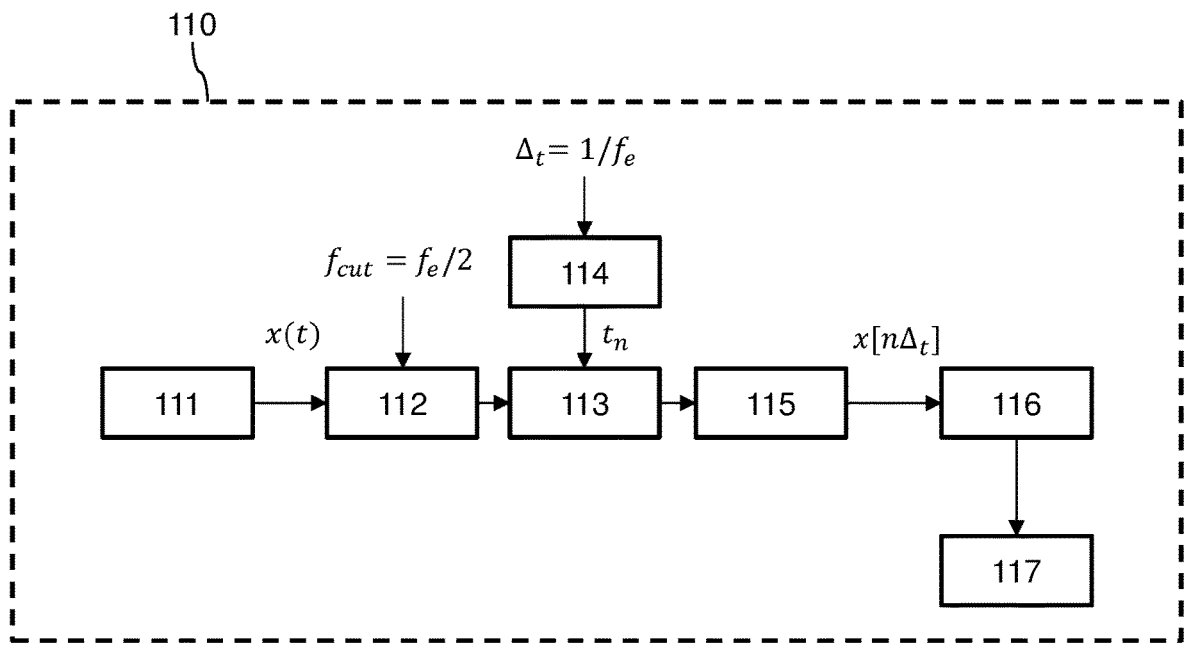
FIG. 1 is a schematic representation of an acquisition module according to the prior art.
Figure 2:
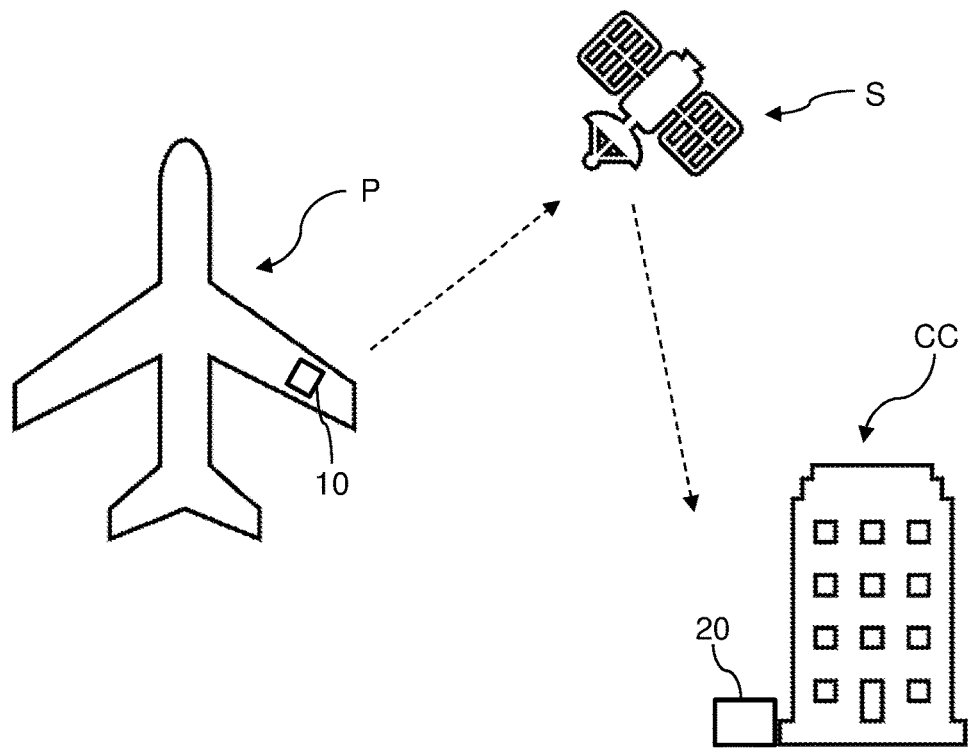
FIG. 2 is a schematic representation of a system for monitoring an aircraft engine according to the invention.

With reference to FIG. 2, an aircraft P in flight and a control center CC on the ground for monitoring the aircraft P are represented. The aircraft P comprises several engines of which at least one engine is monitored continuously in order to track its state of health. To this end, the monitoring system comprises an acquisition module 10 connected to one or more engines of the aircraft and a processing module 20 situated on the ground in the control center CC. In this example, the acquisition module 10 can communicate with the processing module 20 via a satellite link S.

A first embodiment of an acquisition module 10 is shown in FIG. 3. The acquisition module 10 comprises a sensor for measuring 11 an analog signal representative of a physical quantity of a part of the aircraft engine.

The acquisition module 10 comprises a measurement sensor 11 configured to measure a physical quantity, for example an acceleration, and to convert it into an analog signal x(t), notably, a voltage signal. The measurement sensor 11 is placed on a part of the aircraft engine, for example, in the vicinity of a fan, a bearing, etc. Such a measurement sensor 11 is known to those skilled in the art and may have various forms as a function of the physical quantity to measure.

Moreover, the acquisition module 10 comprises a sample and hold device 13, configured to collect a sample of the analog signal x(t) at sampling times $t_n$ and to maintain it constant between two sampling times $t_n$. The sample and hold device 13 has a sampling frequency $f_e$ which is chosen to respect the Shannon theorem, that is to say, be at least equal to double the maximum frequency contained in the analog signal x(t) to sample.

According to the invention, the sample and hold device 13 is configured to collect a sample of the analog voltage signal x(t) at sampling times $t_n$ defined according to the following law $$t_n = n\Delta_t + \tau_n$$

in which n is a natural integer $\Delta_t = 1/f_e$ where $f_e$ is the sampling frequency of the sample and hold device (13)

$\tau_n$ is a random variable having a uniform probability law over $$\left[-\frac{\Delta_t}{2}; +\frac{\Delta_t}{2}\right].$$

In this example, with reference to FIG. 3, the acquisition module comprises a timer 14 to determine the sampling times $t_n$ as indicated above.

Thus, thanks to the invention, for monitoring an aircraft engine, the sampling times $t_n$ are determined in a random manner and no longer in a uniform manner as in the prior art. In other words, unlike the prior art in which the time between two sampling times $t_n$ was fixed (FIG. 4), the time between two sampling times $t_n$ is henceforth variable (FIG. 5).

The use of a uniform probability law over $$\left[-\frac{\Delta_t}{2}; +\frac{\Delta_t}{2}\right]$$

for the random variable $\tau_n$ is advantageous because it allows optimal spectral statistical properties, the quadratic estimation error being minimal. Furthermore, it makes it possible to obtain unbiased estimators and a minimum variance of the sampling noise. After having performed theoretical computations, it appears that the optimal statistical law for sampling a signal with a number N of samples acquired randomly over an acquisition time T is the uniform statistical law centered on $nT/M = n\Delta_t$ and of width $T/M = \Delta_t$.

Similarly, theoretical computations have shown that the frequency resolution within the context of random sampling is equal to the inverse of the acquisition time T. As a reminder, the acquisition time T is equal to the frequency resolution for a uniform sampling. This property is particularly advantageous for analyzing mechanical signals of a rotating machine because the frequency resolution must be chosen smaller than the spacing between 2 frequency harmonics in order to be able to identify it.

Unlike the prior art, a sampling frequency $f_e$ lower than in the prior art may be chosen throughout the acquisition time T without limiting the pass band of the spectrum of the signal, that is to say, without reducing the Nyquist frequency. Such a sampling frequency $f_e$ is advantageous given that it makes it possible, on the one hand, to limit the number of samples and thus the number of data to transmit to the processing module 20 and, on the other hand, to obtain an optimal frequency resolution, which is advantageous during processing of the samples as will be described hereafter to obtain relevant spectral estimators.

To enable a qualitative estimation, the number of samples must nevertheless remain sufficient in order to obtain a variance of the sampling noise of low value, the variance of the sampling noise being inversely proportional to the numbers of samples. Also, the number of samples may be reduced but within the limit of the desired precision.

Unlike the prior art, the sampling times $t_n$ are required by the processing module 20 in order to compute the estimators and must thus be saved as will be described hereafter. The conservation of the sampling times $t_n$ is not penalizing given that the number of samples is considerably reduced compared to the prior art.

In this example, the acquisition module 10 further comprises an analog bandpass filter having a cut-off frequency $f_{cut}$. The analog bandpass filter 12 is positioned between the measurement sensor 11 and the sample and hold device 13 as illustrated in FIG. 3.

Although having a structure analogous to an anti-aliasing filter according to the prior art, the analog bandpass filter 12 according to the invention makes it possible to reject components of the analog signal x(t) above the cut-off frequency $f_{cut}$ in order to minimize the variance of the spectral estimators computed by the processing module 20. The cut-off frequency $f_{cut}$ thus defines the useful frequency range to explore. Also, the cut-off frequency $f_{cut}$ is chosen to be above the maximum value of the desired spectral range. In a preferred manner, the ratio $f_{cut}/f_e$ is comprised between 3 and 6.

Random sampling has the advantage of not being restricted by the Nyquist limit like uniform sampling. However random sampling has an incidence on the random noise present in the spectrum. Theoretical computations have shown that the variance of the random noise is proportional to the energy of the signal measured. For this reason, it is advantageous to filter, by an analog bandpass filter 12, undesirable frequencies which are above the cut-off frequency $f_{cut}$.

The acquisition module 10 also comprises an analog-digital converter 15 configured to transform the samples maintained constant by the sample and hold device into digital samples $x[n\Delta_t]$ quantified on a limited number of bits which depends on the desired precision. Such an analog-digital converter 15 is analogous to the prior art and known to those skilled in the art.

As illustrated in FIG. 3, the acquisition module 10 further comprises a storage memory 16 for storing the digital samples $x[n\Delta_t]$ as well as the sampling times $t_n$.

In this example, the acquisition module 10 further comprises a communication module 17, for example by satellite means, so as to transmit data from the memory 16 to the processing module 20 situated on the ground in the control center CC.

Unlike the prior art, the sampling times $t_n$ must be stored in the memory 16 in order to allow the processing module 20 to compute estimators of the state of health of the aircraft engine. However, since the number of digital samples $x[n\Delta_t]$ is greatly reduced compared to the prior art, the amount of data having to be transmitted between the acquisition module 10 and the processing module 20 is smaller than in the prior art. This advantageously decreases the transmission cost and reduces the dimensioning of the memory 16.

Thanks to the invention, an acquisition module 10 is obtained which makes it possible to collect a restricted number of digital samples $x[n\Delta_t]$ and sampling times $t_n$ while enabling the computation of relevant estimators by the processing module 20 as will now be described.

The processing module 20 comprises a computation unit, in particular a microprocessor, for carrying out mathematical operations from the digital samples $x[n\Delta_t]$ obtained randomly as well as the sampling times $t_n$.

In a preferred manner, the processing module 20 implements a Dirichlet transform defined in the following manner:

$$X(f) = DIR_{n \to m}^{N}\{x[n\Delta_t]\} = \frac{1}{N}\sum_{n=1}^{N} x[t_n]e^{-j2\pi f t_n}.$$

Where f designates the continuous frequency variable theoretically varying up to infinity and N designates the number of samples.

In order to be able to apply the Dirichlet transform in an optimal manner, knowledge of the frequency resolution $\Delta_f$ is desired. As a reminder, the frequency resolution $\Delta_f$ is equal to the inverse of the acquisition time T: $\Delta_f=1/T$.

In practice, it is not useful to compute frequencies above the cut-off frequency $f_{cut}$ of the analog bandpass filter 12 given that the Fourier coefficients are practically zero. Also, in order to reduce the computation cost, m must take the following values: m=0,1, ... M−1 with M=$f_{cut}/\Delta_f$. Unlike the DFT, the maximal frequency index may exceed the number of samples: M>N, random sampling not being limited by the Shannon theorem.

An example of computation of estimators is described hereafter.

Let $\underline{x}=[x[t_1], x[t_2] \ldots x[t_N]]^T$ ($^T$ designates the transpose operator) a size vector N sampled randomly at the times $t_1 \ldots t_N$ et $\underline{X}=[X[\Delta f], X[2\cdot\Delta f] \ldots X[M\cdot\Delta f]]^T$ its spectrum estimated by the Dirichlet transform, the relationship between $\underline{x}$ and $\underline{X}$ is expressed in matrix form as:

$$\underline{X}=\Phi\cdot\underline{x}$$

where $\Phi$ designates the matrix of size (M, N) of the Dirichlet transform such that:

$$\Phi((m,n)=e^{j2\pi(m-1)\Delta f t_n}, 1 \leq m \leq M \text{ et } 1 \leq n \leq N$$

Similarly, the square envelope spectrum (SES) could also be expressed as:

$$\underline{P}=\Phi\cdot\underline{x}^2$$

where $\underline{x}^2=[x^2[t_1], x^2[t_2] \ldots x^2[t_N]]^T$.

Such estimators are advantageous because they make it possible to reveal in a relevant and reliable manner defects of an aircraft engine and, more generally, a rotating machine.

An exemplary embodiment of a method for monitoring an aircraft engine will henceforth be described by means of the monitoring system described previously. With reference to FIG. 2, the monitoring system comprises an acquisition module 10 connected to one or more engines of the aircraft P and a processing module 20 situated on the ground in the control center CC. In this example, the acquisition module 10 communicates with the processing module 20 by a satellite link S.

The monitoring method comprises a step of measuring, by the measurement sensor 11 of the acquisition module 10, an analog signal x(t) representative of a physical quantity of a part of the rotating machine, for example, an acceleration.

Then, the method comprises a step of filtering, by the bandpass filter 12, frequencies above the cut-off frequency $f_{cut}$ of said bandpass filter 12. Next, the method comprises a step of sampling the analog signal x(t) at sampling times $t_n$ defined in a random manner according to the law defined previously. In this example, the sampling frequency $f_e$ is below 20 kHz, preferably, comprised between 100 Hz and 1000 Hz, further preferably, comprised between 300 Hz and 500 Hz so as to limit the number of samples.

Then, the monitoring method comprises a step of digital conversion of the samples by the analog-digital converter 15 and a step of recording the digital samples $x[n\Delta_t]$ with the sampling times $t_n$ in the memory 16.

Advantageously, the amount of data recorded in the memory 16 is limited compared to the prior art, which enables a less expensive transmission by the communication module 17.

The data of the memory 16, that is to say the digital samples $x[n\Delta_t]$ as well as the sampling times $t_n$ are received by the processing module 20 which can thus compute relevant estimators mathematically. Advantageously, the processing module 20 implements a Dirichlet transform from the digital samples $x[n\Delta_t]$ and the sampling times $t_n$ in order to form relevant indicators, notably, the square envelope spectrum (SES).

Thus, thanks to the invention, relevant estimators may be obtained with a lesser amount of data while conserving relevant data characteristic of rotating machines and, in particular, aircraft engines.

Figure 6:
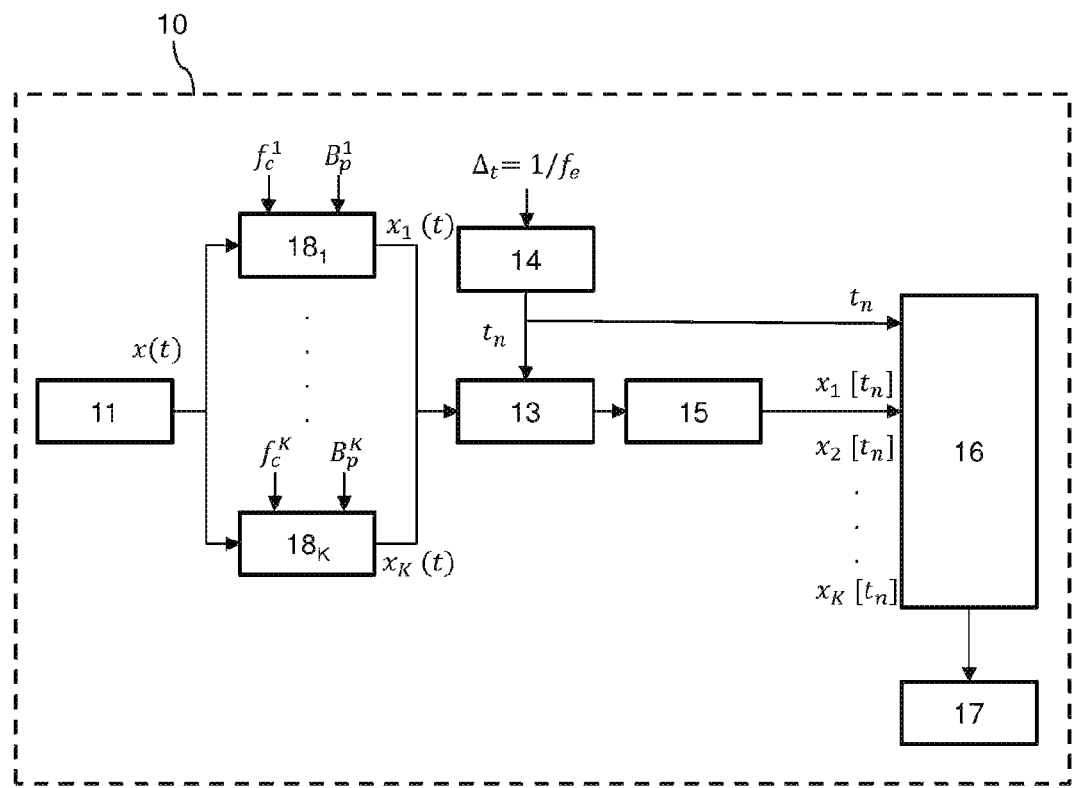

A second embodiment of an acquisition module 10 is represented with reference to FIG. 6. For reasons of brevity and clarity, only structural and functional differences with the first embodiment of FIG. 3 will be described.

In this embodiment, as illustrated in FIG. 6, the bandpass filter 12 is replaced by a plurality of analog bandpass filters $18_1$, $18_K$ which are mounted in parallel with each other.

The bandpass filters $18_1$, $18_K$ make it possible to cut the frequency range into a plurality of elementary frequency ranges which are each sampled in an independent manner by the sample and hold device 13. Each elementary frequency range is defined by its central frequency ($f_c^K$) and its pass band ($B_p$) as illustrated in FIG. 6. The use of bandpass filters $18_1$, $18_K$ is interesting in the case of a planetary or straight gearing in which the signature of defects appears around the tooth-meshing frequency, which is known. In this case, an analog bandpass filter may be applied with a central frequency $f_c$ equal to the tooth-meshing frequency $f_{eng}$ and a band width $B_p$ equal to $f_{eng}/2$.

Advantageously, it is possible to parameterize each elementary frequency range to highlight in a relevant manner a potential defect of the part of the aircraft engine over the elementary frequency range. An elementary frequency range makes it possible to increase the signal to noise ratio, which facilitates the detection of a potential malfunction.

The invention claimed is:

1. An acquisition module for a system for monitoring a rotating machine, the acquisition module comprising:
    at least one sensor for measuring an analog measurement signal x(t) of a physical quantity of a part of the rotating machine,
    at least one sample and hold device configured to collect a sample of the analog signal x(t) at sampling times $t_n$ and to maintain the sample constant between two sampling times $t_n$,
    at least one memory for storing samples
    wherein the sample and hold device is configured to collect a sample of the analog signal x(t) at sampling times $t_n$ defined in a random manner, the sampling times $t_n$ being defined according to the following law:

$t_n = n\Delta_t + \tau_n$ in which,
       n is a natural integer,
       $\Delta_t = 1/f_e$ where $f_e$ is the sampling frequency of the sample and hold device,
       $\tau_n$ is a random variable having a uniform probability law over $$\left[-\frac{\Delta_t}{2}; +\frac{\Delta_t}{2}\right],$$

wherein the samples and the sampling times $t_n$ being stored in the at least one memory.

2. The acquisition module according to claim 1, comprising at least one analog bandpass filter having a cut-off frequency $f_{cut}$, the analog bandpass filter being positioned between the measurement sensor and the sample and hold device.

3. The acquisition module according to claim 1, wherein the sampling frequency $f_e$ is below 20 kHz.

4. The acquisition module according to claim 1, comprising an analog-digital converter configured to transform the samples of the sample and hold device into digital samples $x[n\Delta_t]$.

5. An aircraft comprising an aircraft engine and the acquisition module according to claim 1 of which the measurement sensor is positioned on a part of the aircraft engine.

6. A method for monitoring a rotating machine by use of the acquisition module according to claim 1, the method comprising:
    a step of measuring an analog measurement signal x(t) of a physical quantity of a part of the rotating machine,
    a step of sampling the analog signal x(t) at sampling times $t_n$ defined according to the following law:

$t_n = n\Delta_t + \tau_n$ in which,
       n is a natural integer,
       $\Delta_t = 1/f_e$ where $f_e$ is the sampling frequency of the sample and hold device
       $\tau_n$ is a random variable having a uniform probability law over $$\left[-\frac{\Delta_t}{2}; +\frac{\Delta_t}{2}\right],$$

a step of recording the samples and the sampling times $t_n$.

7. The acquisition module according to claim 1, comprising a plurality of analog bandpass filters each having a cut-off frequency, the analog bandpass filters being positioned between the measurement sensor and the sample and hold device.

8. The acquisition module according to claim 7, wherein the analog bandpass filters are mounted in parallel with each other.

9. A monitoring system comprising the acquisition module according to claim 1 and at least one processing module configured to compute at least one health estimator from the samples and sampling times $t_n$ obtained from said acquisition module.

10. The monitoring system according to claim 9, wherein the processing module comprises a device for transforming the samples according to a Dirichlet transform.

* * * * *